United States Patent [19]

Amano

[11] 4,293,926

[45] Oct. 6, 1981

[54] DYNAMIC TYPE SEMICONDUCTOR MEMORY EQUIPMENT

[75] Inventor: Yutaka Amano, Tokyo, Japan

[73] Assignee: Hitachi, Ltd., Tokyo, Japan

[21] Appl. No.: 11,846

[22] Filed: Feb. 13, 1979

[30] Foreign Application Priority Data

Feb. 13, 1978 [JP] Japan ................................ 53-14099

[51] Int. Cl.³ .................... G11C 7/00; G11C 8/00; G11C 11/00
[52] U.S. Cl. ..................................... 364/900; 365/222
[58] Field of Search ................. 364/200, 900; 365/222

[56] References Cited

U.S. PATENT DOCUMENTS

| | | | |
|---|---|---|---|
| 3,760,379 | 9/1973 | Nibby et al. ........................ | 365/222 |
| 4,084,154 | 4/1978 | Panigrahi ............................ | 364/900 |

OTHER PUBLICATIONS

IBM Technical Disclosure Bulletin, vol. 21, No. 7, Dec. 1978, pp. 2897-2898.

IBM Technical Disclosure Bulletin, vol. 15, No. 1, Jun. 1972, pp. 257-258.

IBM Technical Disclosure Bulletin, vol. 19, No. 3, Aug. 1976, pp. 758-759.

*Primary Examiner*—Gareth D. Shaw
*Assistant Examiner*—John G. Mills
*Attorney, Agent, or Firm*—Craig and Antonelli

[57] ABSTRACT

A dynamic type semiconductor memory equipment operative in an asynchronous refresh mode in a data processing system including a CPU and a plurality of the memory equipments is so arranged that no busy signal is sent to the CPU through a common busy signal bus shared in common by all the memory equipments when any given memory equipment is in a refreshing operation state. Access request from the CPU to the memory equipment in the refresh mode is accepted and temporarily stored therein to be executed after completion of the refresh operation, while access request to other memory equipments in which no refresh operation takes place can be accepted to be executed without latency.

16 Claims, 3 Drawing Figures

DYNAMIC TYPE SEMICONDUCTOR MEMORY EQUIPMENT

BACKGROUND OF THE INVENTION

1. Field of the Invention

The present invention relates to a dynamic type semiconductor memory equipment operative in an asynchronous refresh mode for data processing systems. In particular, the invention concerns a control circuit used in such memory equipment.

2. Description of the Prior Art

In general, the dynamic type semiconductor memory element is adapted to store information in terms of the presence and absence of electric charge. Because the electric charge is progressively discharged due to unavoidable leakage in the circuitry of the memory element, a refreshing operation is required for supplementing the lost charge within a predetermined time. Such a refresh operation may be effected in two different modes. In the first mode, referred to as the synchronous refresh mode, a refresh command signal is periodically issued to the memory equipments from an external unit such as, for example, a central processing unit, hereinafter referred to as a CPU, thereby to effect periodically the refershing operation in all the memory devices or equipments. On the other hand, in the second refresh mode, which is referred to as asynchronous refresh mode, a refresh request circuit is inherently incorporated in each of the memory equipments, whereby the refreshing operation for the memory elements of any given memory equipment is spontaneously effected in response to the refresh request signal independently from the other memory equipments.

In the hitherto known dynamic type semiconductor memory equipment operative in the asynchronous refresh mode, when the refresh operation is initiated in a memory equipment, a signal indicating that the memory equipment is in operation (this signal will be hereinafter referred to also as the busy signal) is produced and sent to an external unit such as a central processing unit for inhibiting the access request therefrom to the memory equipment in the busy state. When a plurality of the memory equipments are provided, the busy signal lines from the various memory equipments are usually combined into a single common bus connected to the CPU. Accordingly, when the refresh operation is effected in one of the semiconductor memory equipments, resulting in the busy signal being sent to the busy signal bus common to all the memory equipments, the CPU is inhibited from making access to the other memory equipments and has to wait until the refreshing operation being effected has been completed. In an extreme case in which all the memory equipments successively perform the refresh operations in sequence, a remarkably great time is required in vain before the access request to any one of the memory equipments is allowed from the CPU, since the latter has to wait until the refresh operations in all the memory equipments have been completed. This means a significant reduction in the otherwise available capability of the CPU.

SUMMARY OF THE INVENTION

An object of the present invention is to provide a dynamic type semiconductor memory equipment operative in the asynchronous refresh mode for data processing system including a CPU which allows the CPU to make access to the non-busy memory equipments without requiring the latency time even when any one of the memory equipments connected to a common bus leading to CPU is busy in the refresh operation, thereby to enhance the availability of the CPU.

In view of the above and other objects which will become more apparent as description proceeds, there is proposed according to an aspect of the invention a dynamic type semiconductor memory equipment for a data processing system which includes preference control means adapted to select either one of the access request to the memory equipment or the refresh request with preference over the other and to send out the busy signal to a busy signal bus only when the memory access request is accepted by the memory equipment. Since no busy signal is sent out when any given memory equipment is in the refreshing state, the CPU of the data processing system can make access to any memory equipments in which no refresh operation takes place without latency time, thereby to execute write-in/read-out operations. In this manner, the time required for the CPU to make access to the memory equipments can be decreased by the latency time which has been heretofore involved by the refreshing operation in any one of the memory equipments, whereby the processing capability of the CPU can be correspondingly enhanced. Further, by virtue of the fact that the busy signal is sent out only during the operation of the memory i.e. during the write-in/read-out operation to the memory device in the memory equipment, it is also possible to utilize the busy signal for informing the CPU that the access request therefrom has been accepted and now is being executed. Besides, termination of the busy signal may be utilized for signalling to CPU that the requested write-in or read-out operation to the memory unit or block in the memory equipment has been completed. In other words, the busy signal may be additionally utilized for controlling the operation sequence of the CPU.

DETAILED DESCRIPTION OF THE PREFERRED EMBODIMENTS

Figure 1:
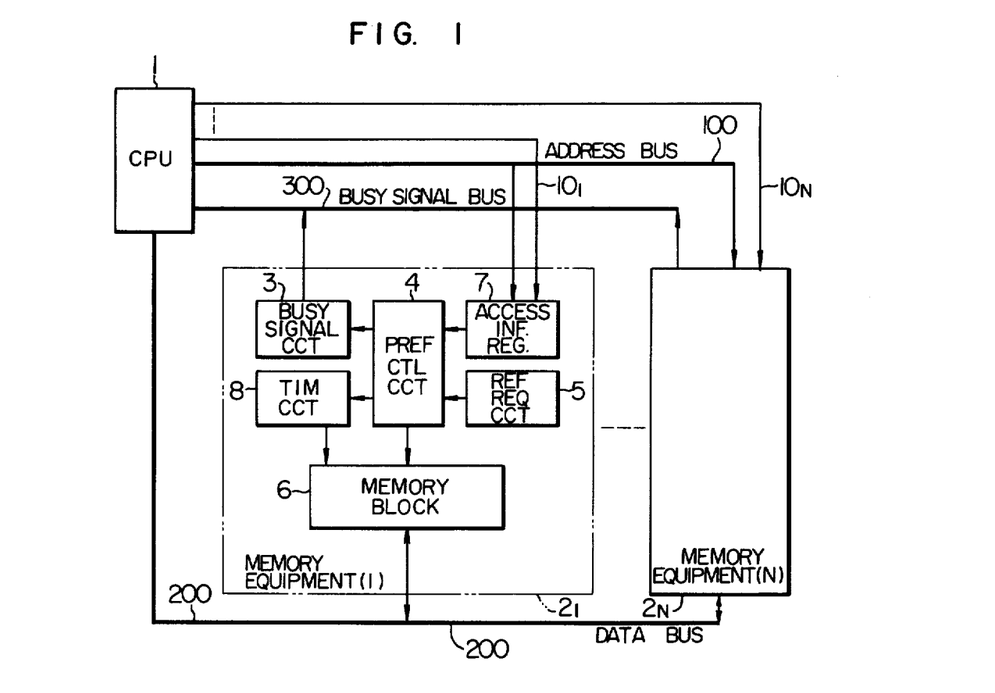
FIG. 1 is a block diagram illustrating schematically a general arrangement of the dynamic type semiconductor memory equipment according to an embodiment of the invention together with a data processing system.

Referring to FIG. 1 which is a block diagram showing schematically a general arrangement of a data processing system according to an embodiment of the invention, reference numeral 1 denotes a central processing unit or CPU, $2_1$ to $2_N$ denote dynamic type semiconductor memory equipments, 3 denotes a busy signal sender circuit for sending out a signal indicating a busy state of an associated memory device (this signal will be referred to also as the busy signal), 4 denotes a preference control circuit for an access request from CPU 1 and a refresh request from a refresh request circuit 5, and numeral 6 denotes a memory block which includes dynamic type semiconductor memory or storage elements and associated peripheral devices such as an address driver circuit, a read-out/write-in command circuit, a read-out circuit and a write-in circuit. Further, reference numeral 7 denotes an access information register for receiving and holding access information from CPU 1, and 8 designates a timing circuit for generating various timing signals required for the operations of the memory equipment $2_1$ inclusive of the memory block 6. Numeral 100 designates an address bus common to all the memory equipments $2_1$ to $2_N$, while numerals $10_1$ to $10_N$ denote access request leads from CPU 1 to the memory equipments $2_1$ to $2_N$, respectively. Numeral 200 denotes a data bus shared in common by the memory blocks 6 of all the memory equipments $2_1$ to $2_N$. Read-out and write-in of various data for the memory blocks 6 are effected through this data bus. Finally, reference numeral 300 denotes a bus for the memory busy signal provided in common for all the memory equipments $2_1$ to $2_N$.

In operation, a memory access request issued from CPU 1 is received by the access information register 7 of the designated memory equipment to be latched therein. More particularly, a corresponding memory address signal is fetched in from the address bus 100, while a starting synchronous signal is received through the associated one of the access request leads $10_1$ to $10_N$, whereby these signals are latched by the access information register 7.

In the case in which no refresh request signal is produced from the refresh request circuit 5 upon appearance of the memory access request signal from CPU 1 to the associated memory equipment, e.g. equipment $2_1$, the preference control circuit 4 allows access to the memory block 6 in accordance with the access information. Simultaneously, the memory busy signal is sent out to the busy signal bus 300.

When the refresh request signal is produced from the refresh request circuit 5 in the absence of the memory access request from CPU 1, the refresh operation is allowed to be performed. In this case, however, the control is made by the preference control circuit 4 in such manner that no memory busy signal is sent out to the busy signal bus 300 from the busy signal sender circuit 3. By virtue of such an arrangement, when a memory access request is produced from the CPU to a given memory equipment such as the equipment $2_1$ in which the refresh operation is being executed, the memory access information will then be latched by the access information register 7 of the concerned memory equipment $2_1$. Thus, the access request from CPU 1 to the associated memory block has to wait for completion of the refresh operation. Such a latching or waiting function may be implemented also in hitherto known data processing systems. However, it should be noted that, according to the teaching of the invention, because no memory busy signal is sent out during the refresh operation of any given memory equipment such as equipment $2_1$, the memory access request from CPU 1 to the other memory equipment such as $2_N$ for example can be executed without requiring latency time unless the refresh operation is carried out in that memory equipment $2_N$. The preference control circuit according to the invention is adapted to select either one of the memory access request signal from CPU 1 and the refresh request signal from the refresh request circuit 5 when both of these signals make appearance simultaneously for one and the same memory equipment, whereby the other or non-selected signal has to wait for the completed execution of the selected request.

Figure 2:
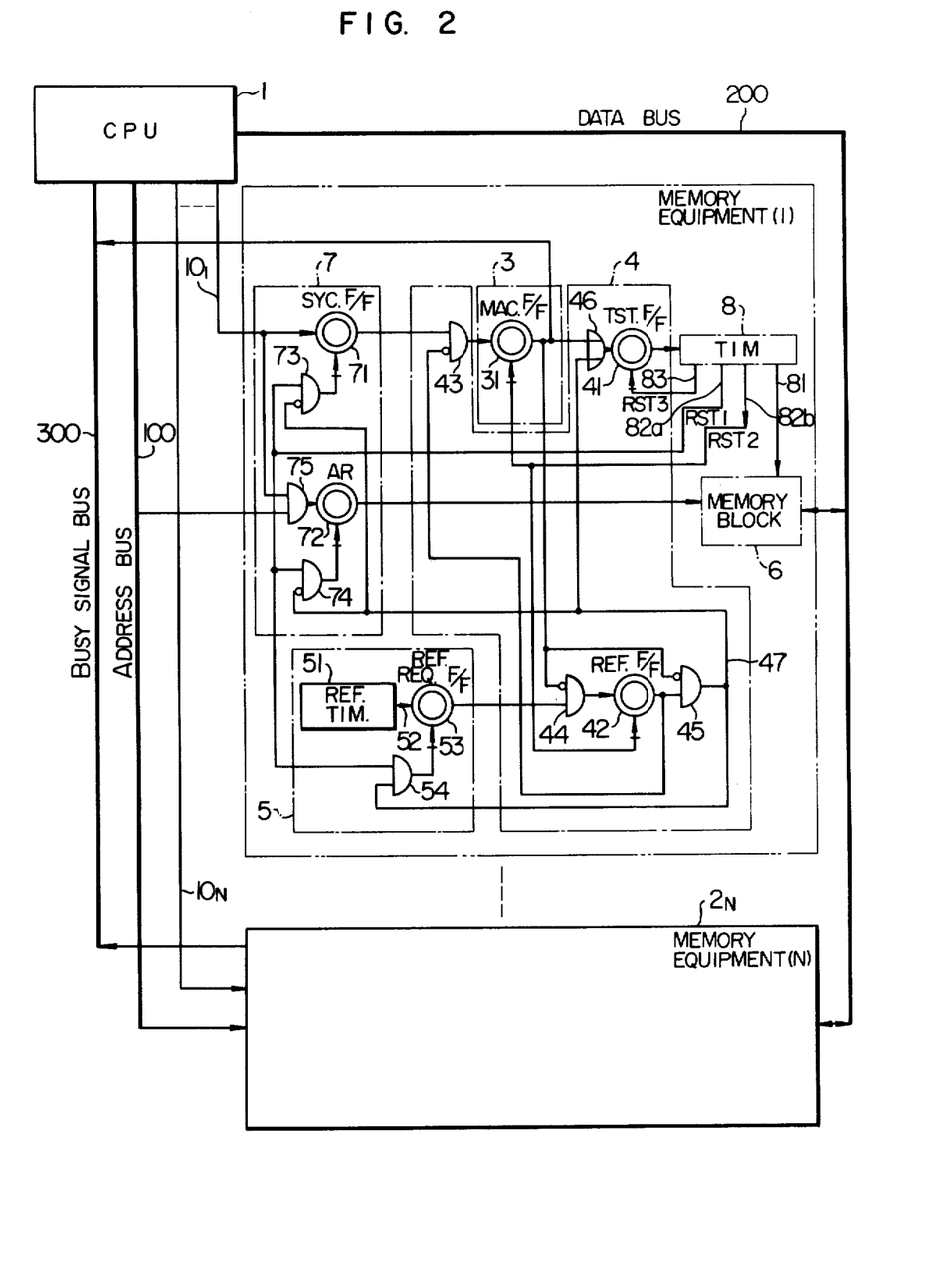
FIG. 2 is a block diagram to show in detail an arrangement of the dynamic type semiconductor memory equipment according to an embodiment of the invention.

FIG. 2 shows in more detail an arrangement of the data processing system according to an embodiment of the invention. As can be seen from this figure, the access information register 7 is composed of a flip-flop (SYC F/F) 71 for holding the starting synchronous signal issued from CPU 1 through the associated one of the access request leads $10_1$ to $10_N$ and an address register (AR) 72 for storing the address information from the address bus 100. Under the conditions that a reset pulse signal ($RST_1$) is produced on an output lead 82a of the timing circuit 8 and that the refresh operation is not executed, the flip-flop 71 and the address register 72 are reset through respective AND circuits 73 and 74. The gate circuit 75 serves to allow the address information to be fetched only by the memory equipment designated (or started) by CPU 1. The refresh request circuit 5 comprises a refresh timer circuit 51 for producing refresh timing pulse signal 52 of a predetermined constant frequency and a refresh request flip-flop (REF REQ F/F)53 which is adapted to be reset by the reset signal $RST_1$ on the line 82a through a gate circuit 54 upon completion of the refresh operation. The preference control circuit 4 is composed of a memory timing start flip-flop (TST F/F)41 and a refresh indicating flip-flop (REF F/F)42 and adapted to select either one of the access request from CPU 1 or the refresh request with preference with the aids of gate circuits 43 to 46. The busy signal sender circuit 3 includes a memory access flip-flop (MAC F/F)31 adapted to be set upon reception of the access request from CPU 1.

Next, operation of the system shown in FIG. 2 will be described for the three different assumptions that: (1) only the access request from CPU 1 is present; (2) only the refresh request is present; and (3) both the access request from CPU 1 and the refresh request are present.

1. Presence of only the access request from CPU 1

The access information from CPU 1 is received by the access information register 7. More specifically, the flip-flop 71 or SYC F/F for holding the starting synchronous signal is set in dependence on the access information from CPU 1 with the address register or AR 72 being also set. Since it is assumed that no refresh request is present at that time, the refresh indicating flip-flop or REF F/F 42 is in the reset state to open or enable the gate circuit 43. Consequently, the memory access flip-flop or MAC F/F 31 of the memory busy signal sender circuit 3 is set, as the result of which the memory timing start flip-flop or TST F/F 41 is set thereby to start the timing circuit 8. At the same time, a memory block drive signal is applied to the memory block 6 through the signal line 81 to allow the read-out or write-in operation relative to the memory block 6 in accordance with the address information fetched in the address register or AR 72. In other words, data transfer can be executed between the memory block 6 and CPU 1 through the data bus 200. Concurrently, the memory busy signal is supplied to CPU 1 from the memory busy signaling circuit 3 through the busy signal bus 300. Before the read-out or write-in operation has been completed, the flip-flop or SYC F/F 71 and AR 72 of the access information register 7 are first reset by the signal RST 1 produced on the output line 82a of the timing circuit 8, while MAC F/F 31 of the memory busy signal sender circuit 3 as well as REF F/F 42 of the preference control circuit 4 are reset by the signal RST 2 produced on the timing output line 82b after the completion of the read-out or write-in operation. Further, when the memory block drive signal has been applied to the memory block 6 through the signal line 81 for a required time after the starting of the timing circuit 8, a reset pulse signal RST 3 is produced on the line 83 thereby to reset TST F/F 41.

2. Presence of only the refresh request

Assuming by way of example that the length of period required for refreshing the dynamic type memory element in the memory block 6 amounts to 2 ms, and the refresh of the memory block is carried out by refreshing operations sequentially effected 128 times per 2 ms for each memory element, then set signal 52 for REF REQ F/F 53 is produced for every 15.6 μs (÷2 ms/128) by the refresh timer or REF.TIM 51. When REF REQ F/F 53 is set, then REF F/F 42 will be set since MAC F/F 31 is reset to open the gate 44 due to the absence of the access request from CPU 1 on the above assumption, resulting in that TST F/F 41 is set through the gates 45 and 46 to trigger the timing circuit 8 thereby to effect the refresh operation. As is in the case of the preceding assumption 1), the refresh request flip-flop or REF REQ F/F 53 of the refresh request circuit 5 is reset by the signal RST 1 produced on the output line 82a of the timing circuit 8 before the refreshing operation has been completed, while REF F/F 42 of the preference control circuit 4 is reset by the signal RST 2 produced on the line 82b after the completion of the refresh operation. Since MAC F/F 31 is not set at that time, busy signal will never be sent to CPU 1. Accordingly, even if the memory equipment $2_1$ is in the refreshing state, CPU 1 is capable of sending the access request to any one of the memory equipments $2_1$ to $2_N$ through the common bus.

3. Concurrent occurrence of both access request and refresh request

The access information from CPU 1 is received in the access information register 7 as described above in conjunction with the case 1). When MAC F/F 31 is set to close the gate 44, REF F/F 42 will not be set even if REFREQ F/F 53 is set. Consequently, the access request from CPU 1 is executed in the manner described above in conjunction with the assumed case 1). When the signal RST 1 is produced on the line 82a in the course of the operation to the memory block 6 in accordance with the access information from CPU 1, the flip-flop SYC F/F 71 and AR 72 of the access information register 7 are reset, while MAC F/F 31 is reset upon generation of the signal RST2 on the line 82b. On the other hand, REF REQ F/F 53 of the refresh request circuit 5 is not reset by the signal RST1 on the line 82a since REF F/F 42 is not set.

When the gate 44 is opened or enabled to set REF F/F 42 simultaneously with MAC F/F 31 being reset by the signal RST2 on the line 82b, the refreshing operation described above in conjunction with the assumed case 2) is initiated. In accordance with the progress of the refreshing operation, REF F/F 42 and REF REQ F/F 53 are reset by the signal RST1 on the line 82a and the signal RST2 on the line 82b, respectively and become in the state ready for accepting the next access request from CPU 1. On the contrary, when REF F/F 42 has been set before MAC F/F 31 is set, the refreshing operation is executed with preference over the access request from CPU 1. In this case, neither the flip-flop 71 nor 72 of the access information register 7 will be reset by the signal RST1 produced on the lines 82a, respectively, in the course of the refreshing operation. Accordingly, when REF F/F 42 is reset to open the gate 43 thereby to set MAC.F/F 31, the access request from CPU is executed. At this time, the memory busy signal is sent to CPU 1 through the bus 300. By the way, when both of MAC F/F 31 and REF F/F 42 are set, the gate 45 is closed or blocked by the output from MAC F/F 31 to inhibit the refresh indicating signal 47, whereby the access request from CPU 1 is executed with preference over the refreshing operation.

Figure 3:
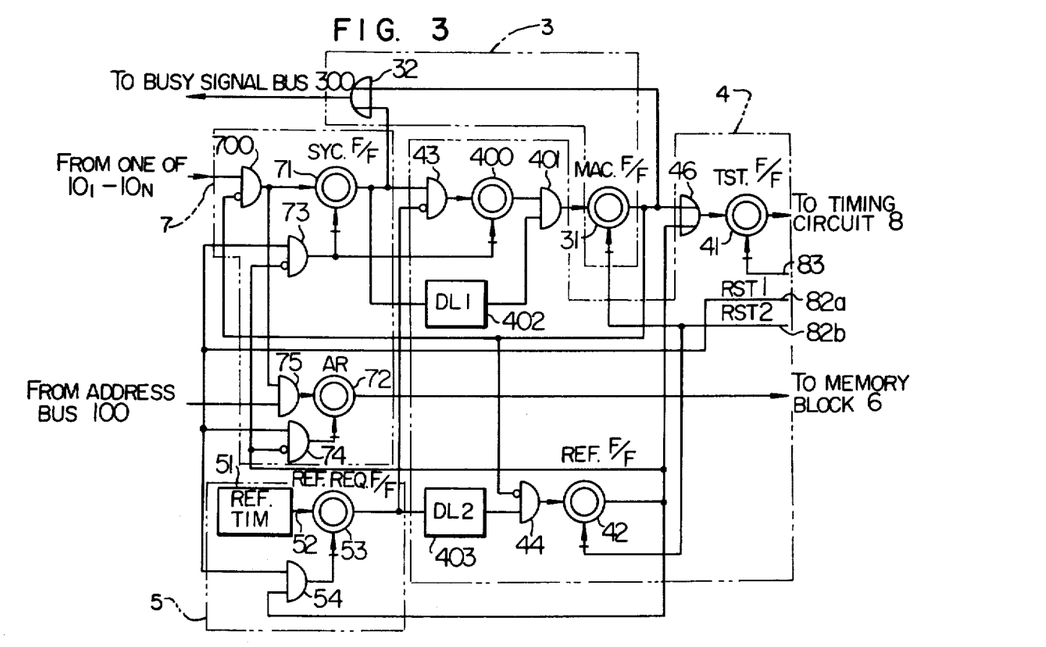
FIG. 3 is a block diagram showing another embodiment of the invention.

FIG. 3 shows a modification of the arrangement shown in FIG. 2. It should be mentioned that only the modified portions are shown together with the directly associated parts in FIG. 3. The remaining arrangement is same as the one shown in FIG. 2. Referring to FIG. 3, a flip-flop 400, delay circuits (DL1, DL2)402 and 403 and a gate circuit 401 serve to prevent erroneous operation which may possibly occur when both of the start signal holding flip-flop (SYC F/F)71 and the refresh request flip-flop (REF REQ F/F)53 are simultaneously set by the access request from CPU 1, resulting in that the output signals from both the flip-flops 71 and 53 make appearance competitively at the input of the AND circuit 43. In more particular, assuming that the outputs from both SYC F/F 71 and REF REQ F/F 53 are simultaneously applied to the input of the AND gate 43, there will be produced a needle-like pulse or spike at the output of the gate 43. If the flip-flop 400 and the gate circuit 401 were absent, application of the needle-like pulse to MAC F/F 31 will produce a set output signal or spike-pulse from MAC F/F 31 in dependence on the pulse width and amplitude of the needle-like input pulse. Thus, when the MAC F/F 31 is to be set for initiation of the timing circuit 8, such initiation may be undesirably caused by a spike which may be generated from REF F/F 42 before the MAC F/F 31 is actually set. Meanwhile, when the REF F/F 42 is to be set for initiation of the timing circuit 8, such initiation may be undesirably caused by a spike which may be generated from MAC F/F 31 before the REF F/F 42 is actually set. Clearly, these undesirable initiations of the timing circuit 8 will lead to erroneous operation of the memory equipment. With a view to evading such erroneous operation, there are provided the flip-flop 400, the delay circuits 402 and 403 and the gate circuit 401. The signal delay time set at the delay circuit or DL1 402 is so selected to be greater than the pulse width of the needle-like pulse appearing at the output of the flip-flop 400 which is produced upon simultaneous application of the output signals from SYC F/F 71 and REF REQ F/F 53 due to difference in characteristics between the gate 43 and the flip-flop 400. Consequently, the output signal from the gate circuit 401 will be definitely logic "1" or "0", thereby to prevent the ambignous operation of MAC.F/F 31. On the other hand, the delay time set at the delay circuit (DL2) 403 is selected longer than the time duration required for the output level from MAC F/F 31 to be definitely established in response to the input signal applied to the gate circuit 43. In this manner, the possibility of both MAC F/F 31 and REF F/F 42 being simultaneously set can be positively excluded, thereby to protect the memory equipment from erroneous operation.

In the case of the system shown in FIG. 2, the busy signal is sent out after MAC F/F 31 has been set, i.e. after the execution of the access request from CPU 1 has been initiated in the memory block. In contrast, in the case of the arrangement shown in FIG. 3, the outputs from SYC F/F 71 and MAC F/F 31 are sent to the busy signal bus through the gate circuit 32 during the time span between the set of SYC F/F 71 and the reset of MAC F/F 31. In other words, the busy signal is sent out starting from the time point at which the access request from CPU 1 has been just received by the memory equipment. In the latter case, inhibition of CPU 1 can be realized more positively as compared with the former case, although the time duration in which the busy signal bus 300 is occupied by the memory busy signal is increased. In this connection, it is to be noted that the busy signal sender circuits employed in the arrangements shown in FIGS. 2 and 3 can be replaced by each other. The selection will be a matter of choice in practical designs.

In FIG. 3, the gate circuit 700 serves to prevent SYC F/F 71 from being erroneously set by false signals such as noise on the external signal lines after the memory equipment has started the processing operation in response to the access request from CPU 1. More particularly, once the memory access request from CPU 1 has been received with the result that MAC F/F 31 has been set, the gate 700 is closed, whereby no external signal can be accepted by the memory equipment until MAC F/F 31 has been reset after the completion of the operation in the memory equipment.

In the foregoing description, it has been assumed that a single CPU is employed. However, the invention can be equally applied to the data processing system of multi-processor type in which more than one CPU is employed by correspondingly providing between the CPU's the competitive access control circuit(s) and the bank busy monitor/control circuit(s) for identifying the access requests to the different memory equipments and performing such control so as to make the competitive access requests effective after a predetermined time period of delay.

As will be appreciated, the present invention has now proposed a dynamic type semiconductor memory equipment operative in an asynchronous refresh mode for data processing systems which does not involve any appreciable reduction in the available processing capability of the CPU by providing means for inhibiting the sending-out of the busy signal in the case in which only the refreshing operation is executed.

I claim:

1. A data processing system comprising at least a central processing unit and a plurality of dynamic type semiconductor memory equipments operative in an asynchronous refresh mode and connected in common to a memory address bus, a memory data bus and a memory busy signal bus, respectively, which extend to said central processing unit, each of said memory equipments including:
    (a) means for receiving a memory starting synchronous signal from said central processing unit and fetching therein a designated memory address,
    (b) memory busy signal sender means for sending a memory busy signal to said central processing unit through said busy signal bus,
    (c) means for effecting transaction of memory data with said central processing unit through said memory data bus in accordance with said memory address, wherein said dynamic type semiconductor memory equipment operative in an asynchronous refresh mode includes:

(i) a memory starting register for receiving at the input thereof said memory starting synchronous signal from said central processing unit, latching said memory starting synchronous signal and sending a memory access request signal, and adapted to be reset upon reception of a first reset signal produced when said refresh operation indicating signal is absent,
   (ii) an address register for fetching therein said memory address from said central processing unit through said memory address bus in response to said memory starting synchronous signal, latching said memory address and sending an addressing output signal therefrom to a memory block incorporated in each of said dynamic type semiconductor memory equipments, and adapted to be reset upon reception of said first reset signal produced when said refresh operation indicating signal is absent,
   (iii) a refresh request circuit including means for producing a refresh request pulse at a predetermined refresh period, means for latching said refresh request pulse to send a refresh request signal and means for resetting said refresh request signal by said first reset signal when a refresh operation indicating signal for indicating that refresh operation takes place is present,
   (iv) a preference control circuit including a memory access flip-flop and a refresh operation indicating flip-flop for producing said refresh operation indicating signal, said flip-flops being so adapted that either one of them is set with preference over the other in response to either one of said memory access request signal and said refresh request signal, while both of said flip-flops are adapted to be reset by said second reset signal, and a timing start flip-flop adapted to be set in dependence on the logical sum of the output signals from both of said memory access flip-flop and said refresh operation indicating flip-flop and reset by a third reset signal, (v) a timing circuit adapted to be started in response to said output signal from said timing start flip-flop thereby to produce a predetermined memory block drive signal, said timing circuit being further adapted to produce said first reset signal at a given time after termination of said memory block drive signal, to produce said second reset signal at a given time after termination of said first reset signal and to produce said third reset signal after a predetermined time elapse required for producing said memory block drive signal, and
   (vi) means for transmitting said memory busy signal to said central processing unit through said memory busy bus by controlling said memory busy signal sender means with the aid of the output signal from said memory access flip-flop, wherein said preference control circuit includes means for selecting said memory access request signal with preference over said refresh request signal upon concurrent occurrence of both said request signals by utilizing as said refresh operation indicating signal a logical product of the output of said refresh operation indicating flip-flop and the inverted output of said memory access flip-flop.

2. A data processing system comprising at least a central processing unit and a plurality of dynamic type semiconductor memory equipments operative in an asynchronous refresh mode and connected in common to a memory address bus, a memory data bus and a memory busy signal bus, respectively, which extend to said central processing unit, each of said memory equipments including:

(a) means for receiving a memory starting synchronous signal from said central processing unit and fetching therein a designated memory address, (b) memory busy signal sender means for sending a memory busy signal to said central processing unit through said busy signal bus, (c) means for effecting transaction of memory data with said central processing unit through said memory data bus in accordance with said memory address, wherein said dynamic type semiconductor memory equipment operative in an synchronous refresh mode includes:

(i) a memory starting register for receiving at the input thereof said memory starting synchronous signal from said central processing unit, latching said memory starting synchronous signal and sending a memory access request signal, and adapted to be reset upon reception of a first reset signal produced when said refresh operation indicating signal is absent, (ii) an address register for fetching therein said memory address from said central processing unit through said memory address bus in response to said memory starting synchronous signal, latching said memory address and sending an addressing output signal therefrom to a memory block incorporated in each of said dynamic type semiconductor memory equipments, and adapted to be reset upon reception of said first reset signal produced when said refresh operation indicating signal is absent, (iii) a refresh request circuit including means for producing a refresh request pulse at a predetermined refresh period, means for latching said refresh request pulse to send a refresh request signal and means for resetting said refresh request signal by said first reset signal when a refresh operation indicating signal for indicating that refresh operation takes place is present, (iv) a preference control circuit including a memory access flip-flop and a refresh operation indicating flip-flop for producing said refresh operation indicating signal, said flip-flops being so adapted that either one of them is set with preference over the other in response to either one of said memory access request signal and said refresh request signal, while both of said flip-flops are adapted to be reset by said second reset signal, and a timing start flip-flop adapted to be set in dependence on the logical sum of the output signals from both of said memory access flip-flop and said refresh operation indicating flip-flop and reset by a third reset signal, (v) a timing circuit adapted to be started in response to said output signal from said timing start flip-flop thereby to produce a predetermined memory block drive signal, said timing circuit being further adapted to produce said first reset signal at a given time after termination of said memory block drive signal, to produce said second reset signal at a given time after termination of said first reset signal and to produce said third reset signal after a predetermined time elapse required for producing said memory block drive signal, and (vi) means for transmitting said memory busy signal to said central processing unit through said memory busy bus by controlling said memory busy signal sender means with the aid of the output signal from said memory access flip-flop, wherein said preference control circuit includes a flip-flop adapted to be set by the output signal from first AND gate having inputs applied with the output of said memory starting register and the inverted signal of said refresh request signal and adapted to be reset simultaneously with said memory starting register, and second AND gate having inputs applied with the output signal from said flip-flop and the output signal of said memory starting register which has passed through a first delay circuit having a delay time not smaller than a predetermined time duration required for the operations of said first AND gate said flip-flop, the output signal of said second AND gate serving for setting said memory access flip-flop, which a logical product signal is produced from an inverted output from said memory access flip-flop and said refresh request signal which has passed through a second delay circuit exhibiting a delay time not smaller than a sum of said delay time of said first delay circuit and a minimum time required for the operation of said memory access flip-flop, said logical product signal being used for setting said refresh operation indicating flip-flop.

3. A data processing system comprising at least a central processing unit and a plurality of dynamic type semiconductor memory equipments operative in an asynchronous refresh mode and connected in common to a memory address bus, a memory data bus and a memory busy signal bus, respectively, which extend to said central processing unit, each of said memory equipments including:

(a) means for receiving a memory starting synchronous signal from said central processing unit and fetching therein a designated memory address, (b) memory busy signal sender means for sending a memory busy signal to said central processing unit through said busy signal bus, (c) means for effecting transaction of memory data with said central processing unit through said memory data bus in accordance with said memory address, wherein said dynamic type semiconductor memory equipment operative in an asynchronous refresh mode includes:

(i) a memory starting register for receiving at the input thereof said memory starting synchronous signal from said central processing unit, latching said memory starting synchronous signal and sending a memory access request signal, and adapted to be reset upon reception of a first reset signal produced when said refresh operation indicating signal is absent, (ii) an address register for fetching therein said memory address from said central processing unit through said memory address bus in response to said memory starting synchronous signal, latching said memory address and sending an addressing output signal therefrom to a memory block incorporated in each of said dynamic type semiconductor memory equipments, and adapted to be reset upon reception of said first signal produced when said refresh operation indicating signal is absent, (iii) a refresh request circuit including means for producing a refresh request pulse at a predetermined refresh period, means for latching said refresh request pulse to send a refresh request signal and means for resetting said refresh request signal by said first reset signal when a refresh operation indicating signal for indicating that refresh operation takes place is present, (iv) a preference control circuit including a memory access flip-flop and a refresh operation indicating flip-flop for producing said refresh operation indicating signal, said flip-flops being so adapted that either one of them is set with preference over the other in response to either one of said memory access request signal and said refresh request signal, while both of said flip-flops are adapted to be reset by said second reset signal, and a timing start flip-flop adapted to be set in dependence on the logical sum of the output signals from both of said memory access flip-flop and said refresh operation indicating flip-flop and reset by a third reset signal, (v) a timing circuit adapted to be started in response to said output signal from said timing start flip-flop thereby to produce a predetermined memory block drive signal, said timing circuit being further adapted to produce said first reset signal at a given time after termination of said memory block drive signal, to produce said second reset signal at a given time after termination of said first reset signal and to produce said third reset signal after a predetermined time elapse required for producing said memory block drive signal, and (vi) means for transmitting said memory busy signal to said central processing unit through said memory busy bus by controlling said memory busy signal sender means with the aid of the output signal from said memory access flip-flop, wherein said memory busy signal sender means includes an OR-gate having inputs applied with the output signal from said memory starting register and the output signal from said memory access flip-flop, the output signal from said OR-gate being sent to said central processing unit as said memory busy signal through said memory busy signal bus.

4. A data processing system comprising at least a central processing unit and a plurality of dynamic type semiconductor memory equipments operative in an asynchronous refresh mode and connected in common to a memory address bus, a memory data bus and a memory busy signal bus, respectively, which extend to said central processing unit, each of said memory equipments including:

(a) means for receiving a memory starting synchronous signal from said central processing unit and fetching therein a designated memory address, (b) memory busy signal sender means for sending a memory busy signal to said central processing unit through said busy signal bus, (c) means for effecting transaction of memory data with said central processing unit through said memory data bus in accordance with said memory address, wherein said dynamic type semiconductor memory equipment operative in an asynchronous refresh mode includes:

(i) a memory starting register for receiving at the input thereof said memory starting synchronous signal from said central processing unit, latching said memory starting synchronous signal and sending a memory access request signal, and adapted to be reset upon reception of a first reset signal produced when said refresh operation indicating signal is absent, (ii) an address register for fetching therein said memory address from said central processing unit through said memory address bus in response to said memory starting synchronous signal, latching said memory address and sending an addressing output signal therefrom to a memory block incorporated in each of said dynamic type semiconductor memory equipments, and adapted to be reset upon reception of said first reset signal produced when said refresh operation indicating signal is absent, (iii) a refresh request circuit including means for producing a refresh request pulse at a predetermined refresh period, means for latching said refresh request pulse to send a refresh request signal and means for resetting said refresh request signal by said first reset signal when a refresh operation indicating signal for indicating that refresh operation takes place is present, (iv) a preference control circuit including a memory access flip-flop and a refresh operation indicating flip-flop for producing said refresh operation indicating signal, said flip-flops being so adapted that either one of them is set with preference over the other in response to either one of said memory access request signal and said refresh request signal, while both of said flip-flops are adapted to be reset by said second reset signal, and a timing start flip-flop adapted to be set in dependence on the logical sum of the output signals from both of said memory access flip-flop and said refresh operation indicating flip-flop and reset by a third reset signal, (v) a timing circuit adapted to be started in response to said output signal from said timing start flip-flop thereby to produce a predetermined memory block drive signal, said timing circuit being further adapted to produce said first reset signal at a given time after termination of said memory block drive signal, to produce said second reset signal at a given time after termination of said first reset signal and to produce said third reset signal after a predetermined time elapse required for producing said memory block drive signal, and (vi) means for transmitting said memory busy signal to said central processing unit through said memory busy bus by controlling said memory busy signal sender means with the aid of the output signal from said memory access flip-flop, further including an additional AND-gate having inputs applied with said memory access request signal from said central processing unit and the inverted output signal of said memory access flip-flop, the output signal from said additional AND-gate being supplied to the input of said memory starting register.

5. A data processing system comprising at least a central processing unit and a plurality of dynamic type semiconductor memory equipments operative in an asynchronous refresh mode and connected in common to a memory address bus, a memory data bus and a memory busy signal bus, respectively, which extend to said central processing unit, each of said memory equipments including:

(a) means for receiving a memory starting synchronous signal from said central processing unit and fetching therein a designated memory address, (b) memory busy signal sender means for sending a memory busy signal to said central processing unit through said busy signal bus, (c) means for effecting transaction of memory data with said central processing unit through said memory data bus in accordance with said memory address, wherein said dynamic type semiconductor memory equipment operative in an asynchronous refresh mode includes:

(i) a memory starting register for receiving at the input thereof said memory starting synchronous signal from said central processing unit, latching said memory starting synchronous signal and sending a memory access request signal, and adapted to be reset upon reception of a first reset signal produced when said refresh operation indicating signal is absent, (ii) an address register for fetching therein said memory address from said central processing unit through said memory address bus in response to said memory starting synchronous signal, latching said memory address and sending an addressing output signal therefrom to a memory block incorporated in each of said dynamic type semiconductor memory equipments, and adapted to be reset upon reception of said first reset signal produced when said refresh operation indicating signal is absent, (iii) a refresh request circuit including means for producing a refresh request pulse at a predetermined refresh period, means for latching said refresh request pulse to send a refresh request signal and means for resetting said refresh request signal by said first reset signal when a refresh operation indicating signal for indicating that refresh operation takes place is present, (iv) a preference control circuit including a memory access flip-flop and a refresh operation indicating flip-flop for producing said refresh operation indicating signal, said flip-flops being so adapted that either one of them is set with preference over the other in response to either one of said memory access request signal and said refresh request signal, while both of said flip-flops are adapted to be reset by said second reset signal, and a timing start flip-flop adapted to be set in dependence on the logical sum of the output signals from both of said memory access flip-flop and said refresh operation indicating flip-flop and reset by a third reset signal, (v) a timing circuit adapted to be started in response to said output signal from said timing start flip-flop thereby to produce a predetermined memory block drive signal, said timing circuit being further adapted to produce said first reset signal at a given time after termination of said memory block drive signal, to produce said second reset signal at a given time after termination of said first reset signal and to produce said third reset signal after a predetermined time elapse required for producing said memory block drive signal, and (vi) means for transmitting said memory busy signal to said central processing unit through said memory busy bus by controlling said memory busy signal sender means with the aid of the output signal from said memory access flip-flop, wherein said memory busy signal sender means includes an OR-gate having inputs applied with the output signal of said memory starting register and the output signal from said memory access flip-flop thereby to produce said memory busy signal sent to said central processing unit through said memory busy signal bus, and additionally an AND-gate having inputs applied with said memory access request signal from said central processing unit and the inverted output of said memory access flip-flop thereby to produce an output signal supplied to the input of said memory starting register.

6. In a data memory system including a plurality of dynamic type semiconductor memory equipments operative in an asynchronous refresh mode and connected in common to a memory address bus, a memory data bus and a memory busy signal bus and hence to at least an external unit, while each of said semiconductor memory equipments has a memory starting lead from said external unit independent from the other semiconductor memory equipments, the improvement which comprises the fact that each of said semiconductor memory equipments comprises:

(i) a memory starting register adapted to receive a memory starting synchronous signal from said external unit through said memory starting lead and latch said memory starting synchronous signal thereby to output a memory access request signal, and adapted to be reset by a first reset signal in the absence of a refresh operation indicating signal which indicates that the refresh operation takes place in a memory block incorporated in each of said semiconductor memory equipments, (ii) an address register for responding to said memory starting synchronous signal to fetch and latch therein memory address data from said external unit through said memory address bus thereby to supply said memory address data to said memory block, said address register being adapted to be reset by a first reset signal in the absence of said refresh operation indicating signal, (iii) a refresh request circuit adapted to produce a refresh request pulse at a predetermined refresh period and latch said refresh request pulse thereby to output a refresh request signal, and adapted to reset said refresh request signal by means of said first reset signal in the presence of said refresh operation indicating signal, (iv) a preference control circuit for latching selectively with preference one of said memory access request signal and said refresh request signal which has been produced earlier than the other thereby to produce the memory access signal and the refresh operation indicating signal which are reset by said second reset signal, and latching the memory access signal selected with preference or alternatively said refresh operation indicating signal thereby to produce a timing start signal which is reset by a third reset signal, (v) a timing circuit adapted to be started by said timing start signal thereby to output a predetermined memory block drive signal for said memory block, said timing circuit being adapted to produce said first reset signal at a given time after termination of said memory block drive signal, to produce said second reset signal at a given time after termination of said first reset signal and to produce said third reset signal after a minimum time elapse required for said timing circuit to produce said memory block drive signal in response to said timing start signal, and (vi) a memory busy signal sender circuit for extracting said memory access signal to be sent to said memory busy signal bus as the memory busy signal, wherein said preference control circuit includes a gate circuit which is opened by an inverted signal of said memory access signal thereby to allow said latched refresh request signal to pass therethrough to be used as said refresh operation indicating signal, whereby said memory access signal is allowed to be selected with preference over said refresh request signal upon concurrent occurrence of both of said request signals.

7. In a data memory system including a plurality of dynamic type semiconductor memory equipments operative in an asynchronous refresh mode and connected in common to a memory address bus, a memory data bus and a memory busy signal bus and hence to at least an external unit, while each of said semiconductor memory equipments has a memory starting lead from said external unit independent from the other semiconductor memory equipments, the improvement which comprises the fact that each of said semiconductor memory equipments comprises:

(i) a memory starting register adapted to receive a memory starting synchronous signal from said external unit through said memory starting lead and latch said memory starting synchronous signal thereby to output a memory access request signal, and adapted to be reset by a first reset signal in the absence of a refresh operation indicating signal which indicates that the refresh operation takes place in a memory block incorporated in each of said semiconductor memory equipments, (ii) an address register for responding to said memory starting synchronous signal to fetch and latch therein memory address data from said external unit through said memory address bus thereby to supply said memory address data to said memory block, said address register being adapted to be reset by a first reset signal in the absence of said refresh operation indicating signal, (iii) a refresh request circuit adapted to produce a refresh request pulse at a predetermined refresh period and latch said refresh request pulse thereby to output a refresh request signal, and adapted to reset said refresh request signal by means of said first reset signal in the presence of said refresh operation indicating signal, (iv) a preference control circuit for latching selectively with preference one of said memory access request signal and said refresh request signal which has been produced earlier than the other thereby to produce the memory access signal and the refresh operation indicating signal which are reset by said second reset signal, and latching the memory access signal selected with preference or alternatively said refresh operation indicating signal thereby to produce a timing start signal which is reset by a third reset signal, (v) a timing circuit adapted to be started by said timing start signal thereby to output a predetermined memory block drive signal for said memory block, said timing circuit being adapted to produce said first reset signal at a given time after termination of said memory block drive signal, to produce said second reset signal at a given time after termination of said first reset signal and to produce said third reset signal after a minimum time elapse required for said timing circuit to produce said memory block drive signal in response to said timing start signal, and (vi) a memory busy signal sender circuit for extracting said memory access signal to be sent to said memory busy signal bus as the memory busy signal, wherein said preference control circuit includes a flip-flop adapted to be set by the output signal from a first AND gate having inputs applied with said memory access request signal and the inverted signal of said refresh request signal and adapted to be reset simultaneously with said memory starting register, and a second AND gate having inputs applied with the output signal from said flip-flop and said memory access request signal which has passed through a first delay circuit having a delay time not smaller than a predetermined time duration required for positive operation of said first AND gate and said flip-flop, the output of said second AND gate being latched to be used as said memory access signal, and a third AND gate having inputs applied with the inverted signal of said memory access signal and said refresh request signal which has passed through a second delay circuit exhibiting a delay time not smaller than a sum of said delay time of said first delay circuit and a minimum time required for latching the output signal from said second AND gate, the output signal from said third AND gate being latched to be used as said refresh operation indicating signal, thereby to positively produce selectively only one of said memory access signal and said refresh operation indicating signal.

8. In a data memory system including a plurality of dynamic type semiconductor memory equipments operative in an asynchronous refresh mode and connected in common to a memory address bus, a memory data bus and a memory busy signal bus and hence to at least an external unit, while each of said semiconductor memory equipments has a memory starting lead from said external unit independent from the other semiconductor memory equipments, the improvement which comprises the fact that each of said semiconductor memory equipments comprises:

(i) a memory starting register adapted to receive a memory starting synchronous signal from said external unit through said memory starting lead and latch said memory starting synchronous signal thereby to output a memory access request signal, and adapted to be reset by a first reset signal in the absence of a refresh operation indicating signal which indicates that the refresh operation takes place in a memory block incorporated in each of said semiconductor memory equipments, (ii) an address register for responding to said memory starting synchronous signal to fetch and latch therein memory address data from said external unit through said memory address bus thereby to supply said memory address data to said memory block, said address register being adapted to be reset by a first reset signal in the absence of said refresh operation indicating signal, (iii) a refresh request circuit adapted to produce a refresh request pulse at a predetermined refresh period and latch said refresh request pulse thereby to output a refresh request signal, and adapted to reset said refresh request signal by means of said first reset signal in the presence of said refresh operation indicating signal, (iv) a preference control circuit for latching selectively with preference one of said memory access request signal and said refresh request signal which has been produced earlier than the other thereby to produce the memory access signal and the refresh operation indicating signal which are reset by said second reset signal, and latching the memory access signal selected with preference or alternatively said refresh operation indicating signal thereby to produce a timing start signal which is reset by a third reset signal, (v) a timing circuit adapted to be started by said timing start signal thereby to output a predetermined memory block drive signal for said memory block, said timing circuit being adapted to produce said first reset signal at a given time after termination of said memory block drive signal, to produce said second reset signal at a given time after termination of said first reset signal and to produce said third reset signal after a minimum time elapse required for said timing circuit to produce said memory block drive signal in response to said timing start signal, and (vi) a memory busy signal sender circuit for extracting said memory access signal to be sent to said memory busy signal bus as the memory busy signal, wherein said memory busy signal sender circuit includes an OR gate having inputs applied with said memory access request signal and said memory access signal, the output signal from said OR gate being sent out to said memory busy signal bus as the memory busy signal.

9. In a data memory system including a plurality of dynamic type semiconductor memory equipments operative in an asynchronous refresh mode and connected in common to a memory address bus, a memory data bus and a memory busy signal bus and hence to at least an external unit, while each of said semiconductor memory equipments has a memory starting lead from said external unit independent from the other semiconductor memory equipments, the improvement which comprises the fact that each of said semiconductor memory equipments comprises:

(i) a memory starting register adapted to receive a memory starting synchronous signal from said external unit through said memory starting lead and latch said memory starting synchronous signal thereby to output a memory access request signal, and adapted to be reset by a first reset signal in the absence of a refresh operation indicating signal which indicates that the refresh operation takes place in a memory block incorporated in each of said semiconductor memory equipments, (ii) an address register for responding to said memory starting synchronous signal to fetch and latch therein memory address data from said external unit through said memory address bus thereby to supply said memory address data to said memory block, said address register being adapted to be reset by a first reset signal in the absence of said refresh operation indicating signal, (iii) a refresh request circuit adapted to produce a refresh request pulse at a predetermined refresh period and latch said refresh request pulse thereby to output a refresh request signal, and adapted to reset said refresh request signal by means of said first reset signal in the presence of said refresh operation indicating signal, (iv) a preference control circuit for latching selectively with preference one of said memory access request signal and said refresh request signal which has been produced earlier than the other thereby to produce the memory access signal and the refresh operation indicating signal which are reset by said second reset signal, and latching the memory access signal selected with preference or alternatively said refresh operation indicating signal thereby to produce a timing start signal which is reset by a third reset signal, (v) a timing circuit adapted to be started by said timing start signal thereby to output a predetermined memory block drive signal for said memory block, said timing circuit being adapted to produce said first reset signal at a given time after termination of said memory block drive signal, to produce said second reset signal at a given time after termination of said first reset signal and to produce said third reset signal after a minimum time elapse required for said timing circuit to produce said memory block drive signal in response to said timing start signal, and (vi) a memory busy signal sender circuit for extracting said memory access signal to be sent to said memory busy signal bus as the memory busy signal, further including a gate circuit coupled to said memory starting lead and adapted to be opened by the inverted signal of said memory access signal, wherein said memory starting synchronous signal is received by said memory start register and said address register through said gate circuit.

10. In a data memory system including a plurality of dynamic type semiconductor memory equipments operative in an asynchronous refresh mode and connected in common to a memory address bus, a memory data bus and a memory busy signal bus and hence to at least an external unit, while each of said semiconductor memory equipments has a memory starting lead from said external unit independent from the other semiconductor memory equipments, the improvement which comprises the fact that each of said semiconductor memory equipments comprises:

(i) a memory starting register adapted to receive a memory starting synchronous signal from said external unit through said memory starting lead and latch said memory starting synchronous signal thereby to output a memory access request signal, and adapted to be reset by a first reset signal in the absence of a refresh operation indicating signal which indicates that the refresh operation takes place in a memory block incorporated in each of said semiconductor memory equipments, (ii) an address register for responding to said memory starting synchronous signal to fetch and latch therein memory address data from said external unit through said memory address bus thereby to supply said memory address data to said memory block, said address register being adapted to be reset by a first reset signal in the absence of said refresh operation indicating signal, (iii) a refresh request circuit adapted to produce a refresh request pulse at a predetermined refresh period and latch said refresh request pulse thereby to output a refresh request signal, and adapted to reset said refresh request signal by means of said first reset signal in the presence of said refresh operation indicating signal, (iv) a preference control circuit for latching selectively with preference one of said memory access request signal and said refresh request signal which has been produced earlier than the other thereby to produce the memory access signal and the refresh operation indicating signal which are reset by said second reset signal, and latching the memory access signal selected with preference or alternatively said refresh operation indicating signal thereby to produce a timing start signal which is reset by a third reset signal, (v) a timing circuit adapted to be started by said timing start signal thereby to output a predetermined memory block drive signal for said memory block, said timing circuit being adapted to produce said first reset signal at a given time after termination of said memory block drive signal, to produce said second reset signal at a given time after termination of said first reset signal and to produce said third reset signal after a minimum time elapse required for said timing circuit to produce said memory block drive signal in response to said timing start signal, and (vi) a memory busy signal sender circuit for extracting said memory access signal to be sent to said memory busy signal bus as the memory busy signal, further including a gate circuit coupled to said memory starting lead and adapted to be opened by the inverted signal of said memory access signal thereby to allow said memory starting signal to be received by said memory start register and said address register through said opened gate circuit, wherein said memory busy signal sender circuit includes an OR gate having inputs applied with said memory access request signal and said memory access signal, the output signal from said OR gate being sent to said memory busy signal bus as the memory busy signal.

11. A data processing system as set forth in claim 1 or 2, wherein said memory busy signal sender means includes an OR-gate having inputs applied with the output signal from said memory starting register and the output signal from said memory access flip-flop, the output signal from said OR-gate being sent to said central processing unit as said memory busy signal through said memory busy signal bus.

12. A data processing system as set forth in claim 1 or 2, further including an additional AND-gate having inputs applied with said memory access request signal from said central processing unit and the inverted output signal of said memory access flip-flop, the output signal from said additional AND-gate being supplied to the input of said memory starting register.

13. A data processing system as set forth in claim 1 or 2, wherein said memory busy signal sender means includes an OR-gate having inputs applied with the output signal of said memory starting register and the output signal from said memory access flip-flop thereby to produce said memory busy signal sent to said central processing unit through said memory busy signal bus, and additionally an AND-gate having inputs applied with said memory access request signal from said central processing unit and the inverted output of said memory access flip-flop thereby to produce an output signal supplied to the input of said memory starting register.

14. A dynamic type semiconductor memory equipment as set forth in claim 6 or 7, wherein said memory busy signal sender circuit includes an OR gate having inputs applied with said memory access request signal and said memory access signal, the output signal from said OR gate being sent out to said memory busy signal bus as the memory busy signal.

15. A dynamic type semiconductor memory equipment as set forth in claim 6 or 7, further including a gate circuit coupled to said memory starting lead and adapted to be opened by the inverted signal of said memory access signal, wherein said memory starting synchronous signal is received by said memory start register and said address register through said gate circuit.

16. A dynamic type semiconductor memory equipment as set forth in claim 6 or 7, further including a gate circuit coupled to said memory starting lead and adapted to be opened by the inverted signal of said memory access signal thereby to allow said memory starting signal to be received by said memory start register and said address register through said opened gate circuit, wherein said memory busy signal sender circuit includes an OR gate having inputs applied with said memory access request signal and said memory access signal, the output signal from said OR gate being sent to said memory busy signal bus as the memory busy signal.

* * * * *